United States Patent
Chang et al.

(10) Patent No.: US 10,199,939 B1
(45) Date of Patent: Feb. 5, 2019

(54) MULTI-PHASE DC-DC CONVERTERS WITH OPEN-LOOP PWM FOR TRANSIENT PERFORMANCE ENHANCEMENT

(71) Applicant: DIALOG SEMICONDUCTOR (UK) LIMITED, London (GB)

(72) Inventors: Kevin Yi Cheng Chang, Chandler, AZ (US); James Doyle, Chandler, AZ (US); Qing Li, Chandler, AZ (US); Xiaoying Yu, Chandler, AZ (US); Ibiyemi Omole, Chandler, AZ (US); Jonathon Stiff, Chandler, AZ (US); Erik Mentze, Chandler, AZ (US); Aysel Yildiz, Chandler, AZ (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 0 days.

(21) Appl. No.: 16/036,546

(22) Filed: Jul. 16, 2018

(51) Int. Cl.
*H02M 3/158* (2006.01)
*H03K 7/08* (2006.01)
*H02M 1/15* (2006.01)
*H02M 3/335* (2006.01)

(52) U.S. Cl.
CPC ........... *H02M 3/1582* (2013.01); *H02M 1/15* (2013.01); *H02M 3/1584* (2013.01); *H02M 3/33569* (2013.01); *H03K 7/08* (2013.01)

(58) Field of Classification Search
CPC ....... H02M 1/0845; H02M 2003/1586; H02M 3/1584; H02M 2001/0077
USPC ................. 323/241, 271, 272, 283, 284
See application file for complete search history.

(56) References Cited

U.S. PATENT DOCUMENTS

| | | | | |
|---|---|---|---|---|
| 2005/0237040 A1* | 10/2005 | Rice | ............... | H02M 3/1584 323/282 |
| 2006/0055381 A1* | 3/2006 | Rice | ............... | H02M 3/1584 323/271 |
| 2010/0164454 A1* | 7/2010 | Rinne | ............ | H02M 3/1584 323/282 |
| 2013/0307498 A1* | 11/2013 | Jiang | ................ | G05F 1/10 323/271 |
| 2015/0236595 A1* | 8/2015 | Babazadeh | ....... | H02M 3/1584 323/272 |
| 2017/0060154 A1* | 3/2017 | Ozawa | ............. | G05F 1/575 |

OTHER PUBLICATIONS

U.S. Appl. No. 15/791,270, filed Oct. 23, 2017.
Costabeber et al., "Digital Time-Optimal Phase Shedding Multiphase Buck Converters," IEEE Transactions on Power Electronics, vol. 25, No. 9, Sep. 2010 (pp. 2242-2247).
Jakobsen et al., "Interleaved Buck Converter with Variable Number of Active Phases and a Predictive Current Sharing Scheme," 2008 IEEE Power Electronics Specialists Conference, Jun. 15-19, 2008 (pp. 3360-3365).

\* cited by examiner

Primary Examiner — Gary A Nash
(74) Attorney, Agent, or Firm — Haynes and Boone, LLP

(57) ABSTRACT

A multi-phase switching power converter includes a panic mode detector that triggers the activation of each phase in an open-loop mode of operation in which an open-loop duty cycle is used that is greater than a closed-loop duty cycle used during closed-loop operation for the active phases.

21 Claims, 6 Drawing Sheets

MULTI-PHASE DC-DC CONVERTERS WITH OPEN-LOOP PWM FOR TRANSIENT PERFORMANCE ENHANCEMENT

TECHNICAL FIELD

This application relates to switching power converters, and more particularly to a multi-phase switching power converter with open loop pulse-width modulation (PWM) to enhance transient response.

BACKGROUND

As compared to single phase DC-DC power converters, a multi-phase switching power converter such as a multi-phase buck converter offers improved efficiency for high current loads. In addition, multi-phase operation lowers the ripple current and output voltage ripple. To respond to load current changes, a multi-phase switching power converter may implement phase shedding such that different numbers of phases are activated depending upon the load current. Within each activated phase, a pulse-width modulator controls the duty cycle depending upon feedback from the output voltage. But the feedback-controlled (closed loop) control of the duty cycle is relatively slow and thus cannot accommodate rapid changes in the output current. Moreover, the activation of additional phases can result in serious inter-loop current spike between the inductors of the existing phases and the inductors of the newly-added phases.

Accordingly, there is a need in the art for multi-phase switching power converters with improved response speeds.

SUMMARY

A multi-phase switching power converter is provided with a panic mode detector that triggers open-loop operation in response to the output voltage falling below a voltage droop threshold caused by a sudden application of a load. Alternatively, the panic detector triggers the open-loop operation in response to a change in the output current increasing over a current threshold due to the sudden application of the load. Regardless of how the open-loop operation is triggered, all the available phases in the multi-phase switching power converter are activated to operate according to an open-loop duty cycle such as a 100% pulse width duty cycle. Once the output voltage (or output current) recovers, the open-loop operation is ceased such that conventional closed-loop pulse-width modulation of the activated phases resumes.

To prevent interloop current spikes from the sudden activation of all the phases, a robust phase launching sequence is provided. This sequence may simply be reversed with regard to the de-activation of a phase. These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To speed the response speed, a phase shedding control scheme for a multi-phase switching power converter is disclosed in which the all the phases are activated in an open loop mode in which the duty cycle of the activated phases is set to a large value (e.g., 90%, 95% or even 100%). During this open loop operation, feedback information for the output voltage is not used to adjust the duty cycle of the active phase as would be conventional during closed-loop operation. To trigger the open loop modulation, the multi-phase switching power converter may compare its output voltage to a voltage droop threshold. Should the output voltage sink below the voltage droop threshold, all the available phases are activated with a large open loop duty cycle. The following discussion will assume that the large open loop duty cycle is 100% but it will be appreciated that smaller duty cycles such as 90% or 95% may be used in alternative embodiments. Similarly, the following discussion will assume that all phases are activated during open loop operation but it will be appreciated that less than all available phases may be activated in alternative implementations. In addition, the following discussion will be directed to a multi-phase buck converter but it will be appreciated that the open loop PWM control disclosed herein may be applied to other multi-phase architectures.

Figure 1A:
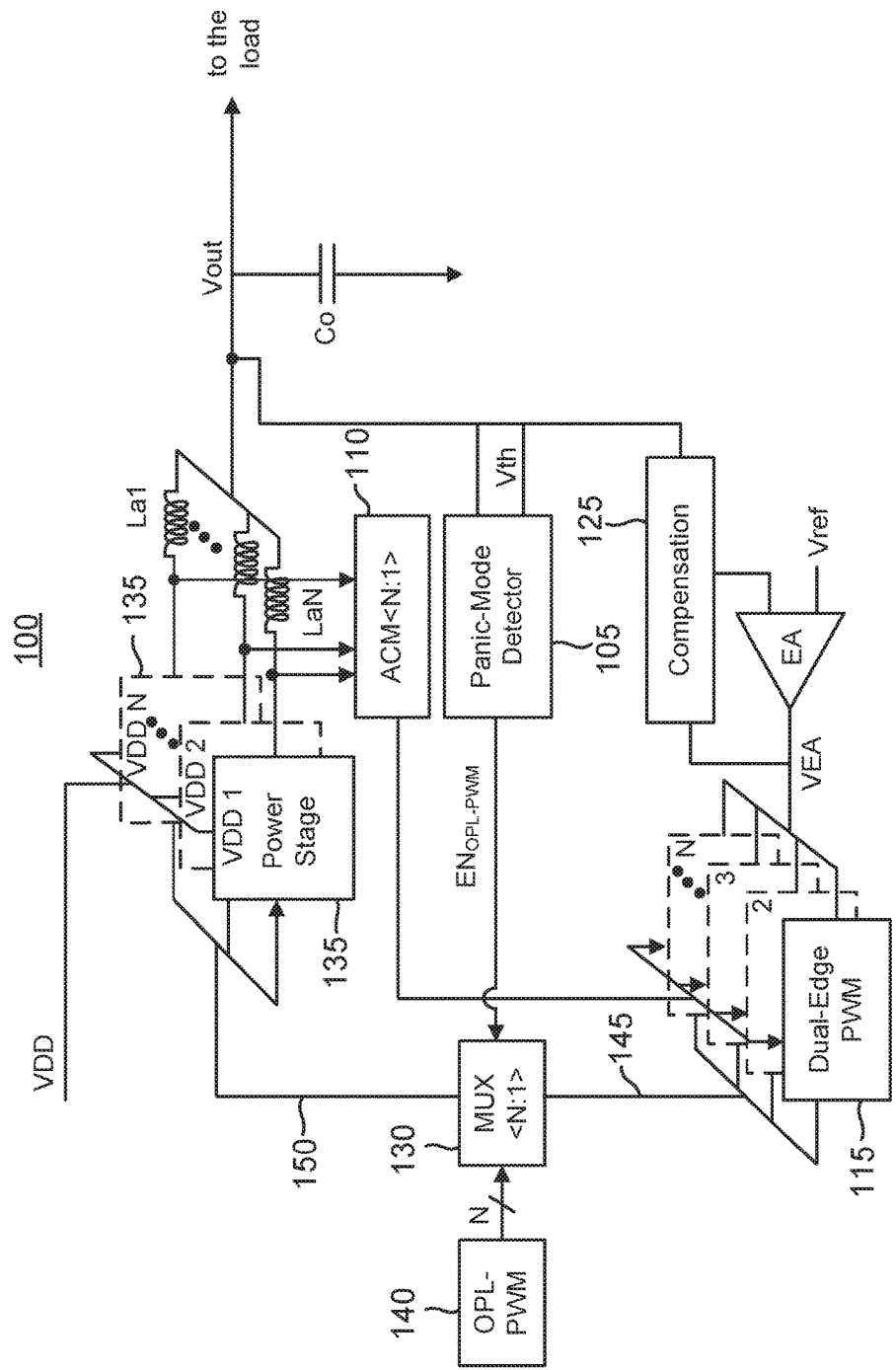
FIG. 1A illustrates an example multi-phase buck converter in which open-loop operation of all the phases is triggered in response to the output voltage falling below a voltage droop threshold in accordance with an aspect of the disclosure.

An example multi-phase buck converter 100 is shown in FIG. 1A that includes a plurality of N phases corresponding to N inductors ranging from a first inductor La1 to an Nth inductor LaN. Each phase includes a power stage 135 having its own high-side switch and a low-side switch driven by a driver (the switches and driver are not shown for illustration clarity). When a phase's high-side switch closes, an input voltage VDD causes a magnetizing current to flow through the phase's inductor as is known in the buck converter arts. As is also known in the buck converter arts, each phase has its own pulse-width modulator (PWM) 115. The active phases all drive an output voltage Vout filtered by an output capacitor Co.

An error amplifier EA that is compensated by a compensation network 125 compares a reference voltage Vref to the output voltage Vout to generate an error voltage VEA that is used by the pulse-width modulators 115 in the active phases to control the pulse widths for the switching in these active phases during closed loop operation. An average current sensor 110 senses the average inductor currents in the active phases during normal (closed loop) operation. As will be explained further herein, each pulse width modulator (PWM) 115 includes a dual-ramp generator that generates a dual-ramp signal. A comparator within each PWM 115 compares its dual-ramp signal to the error signal VEA to generate a pulse-width modulated closed-loop control signal 145 that may control the pulse-width modulated switching in the corresponding power stage 135. To keep the inductor currents balanced during normal operation, each PWM 115 adjusts the common-mode or center voltage of its dual-ramp signal responsive to the average currents sensed by average current sensor 110 as described in U.S. application Ser. No. 15/791,270, filed Oct. 23, 2017, the contents of which are incorporated herein in their entirety. During normal operation, a multiplexer 130 selects for control signals 145 to form corresponding selected control signals 150 that control the pulse width modulation in the active phases. A panic-mode detector 105 controls multiplexer 130 responsive to a comparison of the output voltage Vout to a voltage droop threshold (Vth). If Vout is greater than the voltage droop threshold Vth, panic-mode detector 105 controls multiplexer 130 to select for PWM closed-loop control signals 145 to form corresponding selected control signals 150. But if the output voltage Vout is less than the voltage droop threshold Vth, panic-mode detector 105 controls multiplexer 130 to select for open-loop PWM control signals (OPL-PWM) 140 to form corresponding selected control signals 150. The pulse width modulation during such a panic mode of operation is thus not responsive to the feedback information provided by the error voltage VEA and so the ensuing pulse width modulation is open loop.

Figure 1B:
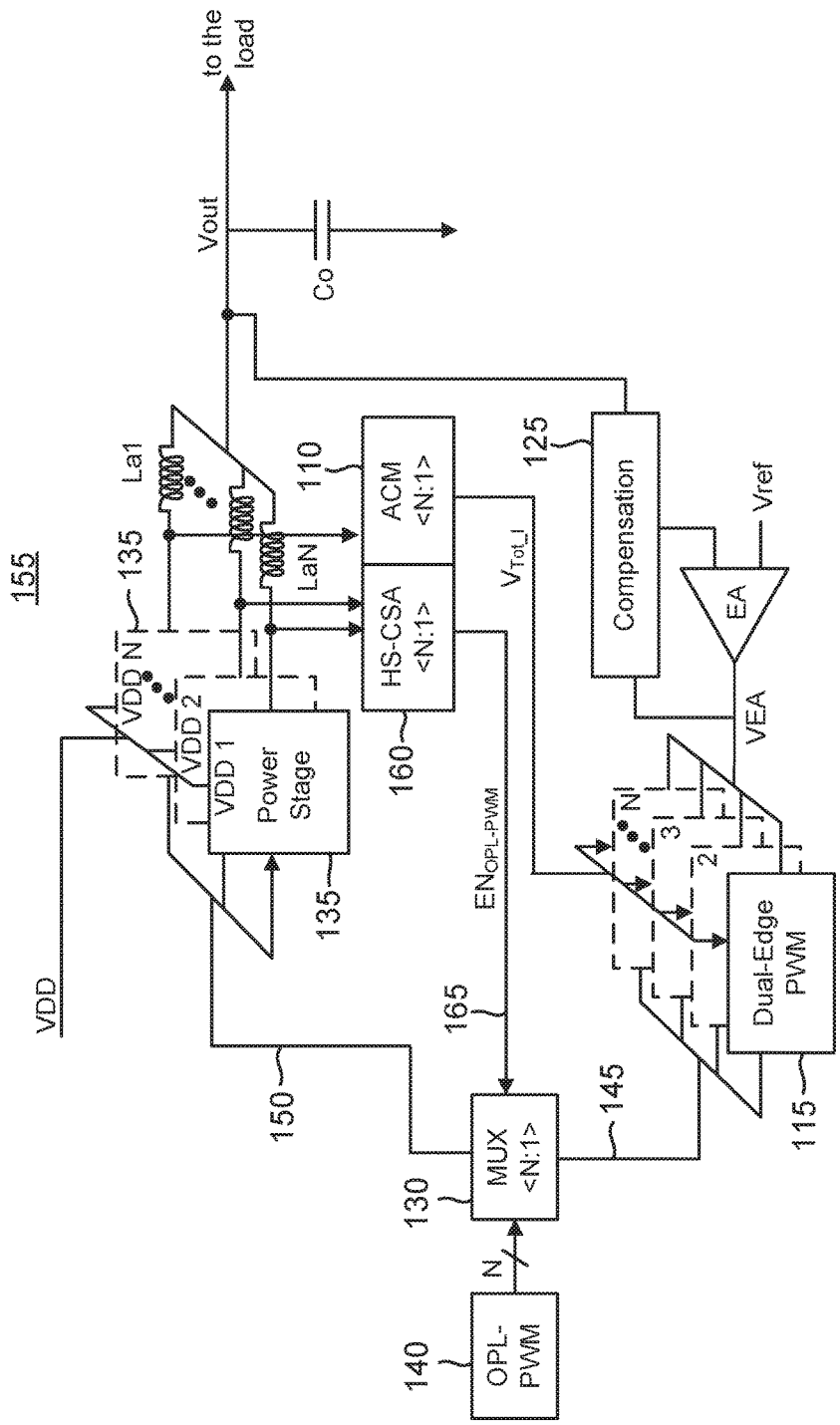
FIG. 1B illustrates an example multi-phase buck converter in which open-loop operation of all the phases is triggered in response to a change in the output current exceeding a current threshold in accordance with an aspect of the disclosure.

In an alternative embodiment, the panic mode is triggered by a current threshold as illustrated in FIG. 1B for a multi-phase buck converter 155. Power stages 135, the inductors, error amplifier EA, compensation network 125, output capacitor Co, average current sensor 110, and PWMs 115 function as discussed with regard to multi-phase buck converter 100. To perform the current threshold detection for the open loop operation, a high-speed current sensor (HS-CSA) 160 functions to detect relatively rapid or sudden changes in the inductor currents. High-speed current sensor 160 compares the total inductor current changes to a threshold value to determine whether to enable the panic mode using a enable signal ($EN_{OPL-PWM}$) 165. Should the threshold current change be exceeded, high-speed current sensor 160 asserts enable signal 165 to force multiplexer 130 to select for open-loop PWM control signals 140 to form corresponding selected control signals 150. Conversely, if the threshold current change is not exceeded, high-speed current sensor 160 de-asserts enable signal 165 to force multiplexer 130 to select for closed-loop PWM control signals 145 from PWMs 115.

Figure 2:
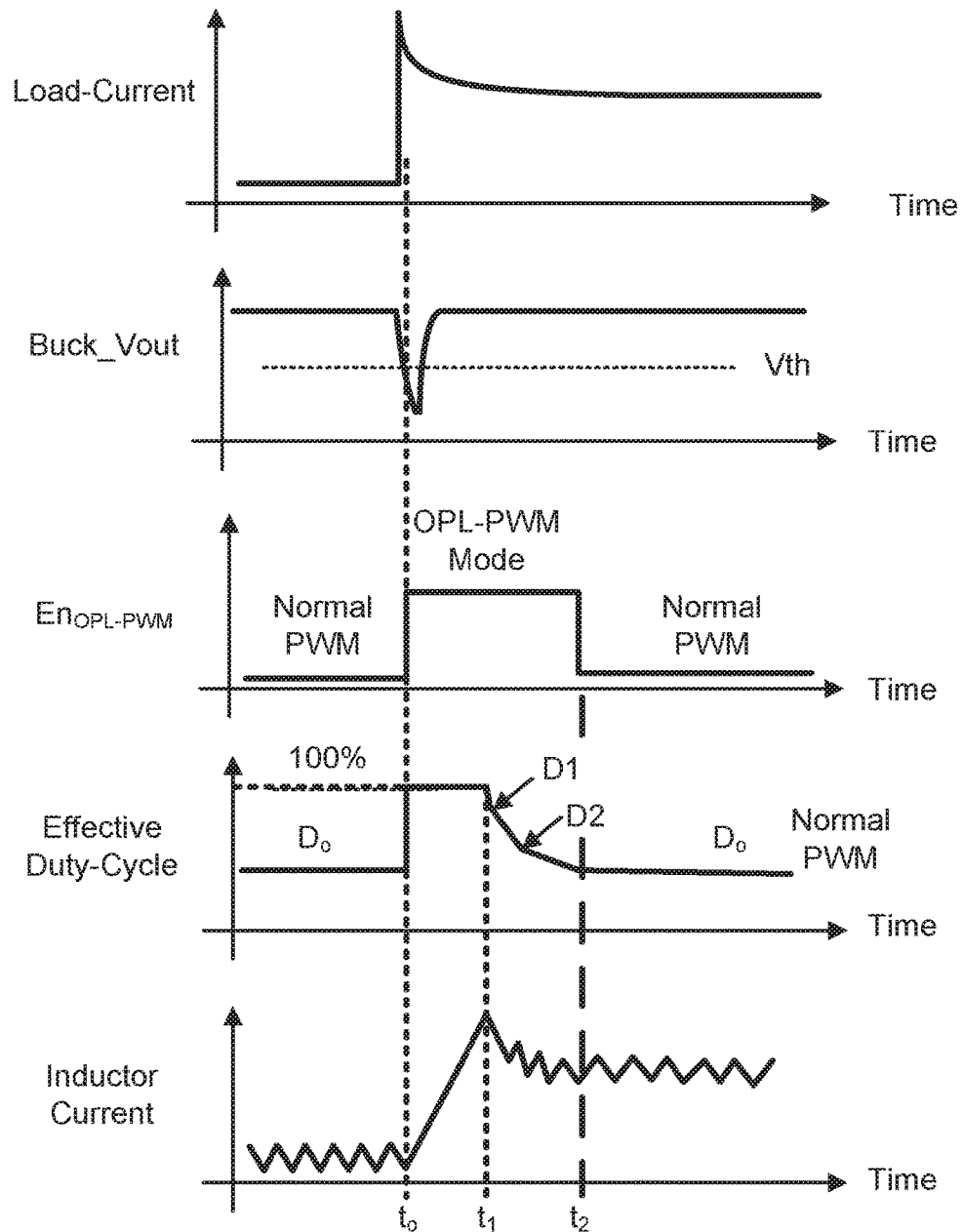
FIG. 2 illustrates some waveforms for the multi-phase buck converter of FIG. 1.

Some waveforms for multi-phase buck converter 100 are shown in FIG. 2. It will be appreciated that the waveforms for multi-phase buck converter 155 are analogous. At a time t0, a load current (the current into the load) increases suddenly. Note that the load current may be greater than the combined inductor output currents from the active phases due to the charge stored on output capacitor Co. The sudden increase in the load current causes the output voltage to sink below the voltage droop threshold Vth so that an open-loop enable signal $En_{OPL-PWM}$ is asserted by panic mode detector 105 (FIG. 1) to begin the OPL-PWM mode of operation. The inductor current thus begins to rapidly ramp up and the output voltage is returned to its steady-state value. To smooth the transition out of open-loop operation into closed-loop operation in which closed-loop PWM control signals 145 form selected control signals 150 that control the switching in power stages 135, the open-loop duty cycle may be progressively decreased beginning at a time t1 until the OPL-PWM mode is ended at a time t2. In particular, the 100% duty cycle is initially decreased to a first deduced duty cycle D1 and then reduced further into a second reduced duty cycle D2 until closed-loop operation resumes using a closed-loop duty cycle $D_0$, where D1 is greater than D2 and D2 is greater than $D_0$.

The theory linking the change in the inductor output current to the open-loop change in the duty cycle for a given active phase will now be discussed. The change in the average inductor current ΔI for a buck converter's active phase during one clock period $T_{CK}$ for the PWM modulation is given by the following equation (1):

$$\Delta I = T_{CK}*D*(Vin - Vout)/L \qquad \text{Eq. (1)}$$

where D is the duty cycle, Vin is the input voltage, and Vout is the output voltage. Equation (1) may be rewritten as shown in the following equation (2) to give the effective duty cycle D as:

$$D = \Delta I*L/(T_{CK}*Vin) + (Vout/Vin) = \Delta D(t) + D_0 \qquad \text{Eq. (2)}$$

where $D_0$ is the steady-state (closed loop) duty cycle equaling (Vout/Vin) and ΔD is given by the following equation (3):

$$\Delta D = \Delta I*L/(T_{CK}*Vin) \qquad \text{Eq. (3)}$$

Therefore, a maximum duty cycle offset ΔDmax to take the present duty cycle to 100% leads to a maximum inductor current change ΔI as given by the following equation (4):

$$\Delta Imax = \Delta Dmax*T_{CK}*Vin/L \qquad \text{Eq. (4)}$$

Figure 3A:
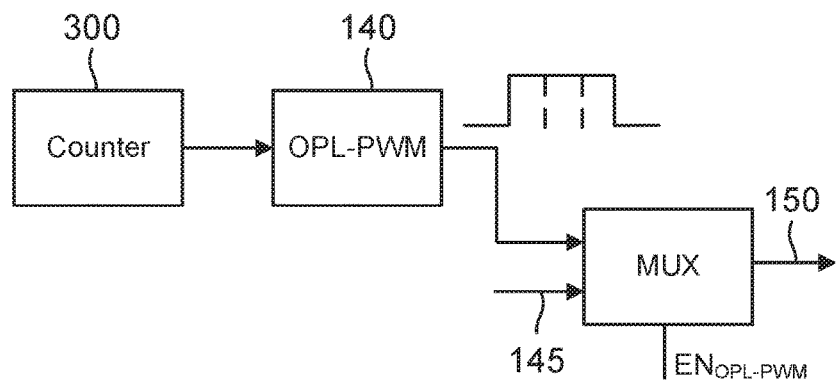
FIG. 3A illustrates a counter for controlling the pulse widths the for open-loop PWM control signals in the multi-phase buck converters of FIGS. 1A and 1B in accordance with an aspect of the disclosure.
Figure 3B:
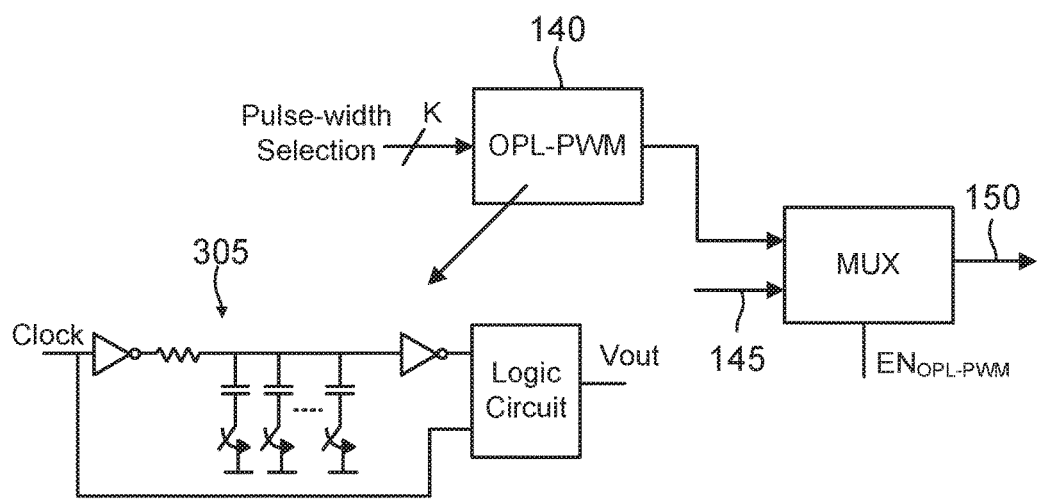
FIG. 3B illustrates a variable RC network for controlling the pulse widths for the open-loop PWM control signals in the multi-phase buck converters of FIGS. 1A and 1B in accordance with an aspect of the disclosure.

The generation of the open-loop PWM control signals 140 may be performed in a number of ways. For example, multiplexer 130 could simply select for the power supply voltage VDD to form each selected control signal 150. Each power stage 135 would then respond to the power supply voltage VDD control signal by implementing a 100% duty cycle over the switching period. Alternatively, a counter 300 may be used to generate each open-loop PWM control signal 140 as shown in FIG. 3A. Open-loop PWM controls signals 140 would then have a pulse width that extends according to a desired number of counts counted by counter 300. Alternatively, the pulse width for open-loop PWM control signals 140 may be controlled by a variable resistor-capacitor (RC) network 305 as shown in FIG. 3B. Depending upon the number of capacitors selected by corresponding switches in RC network 305, the pulse width is either increased or decreased accordingly.

Figure 4A:
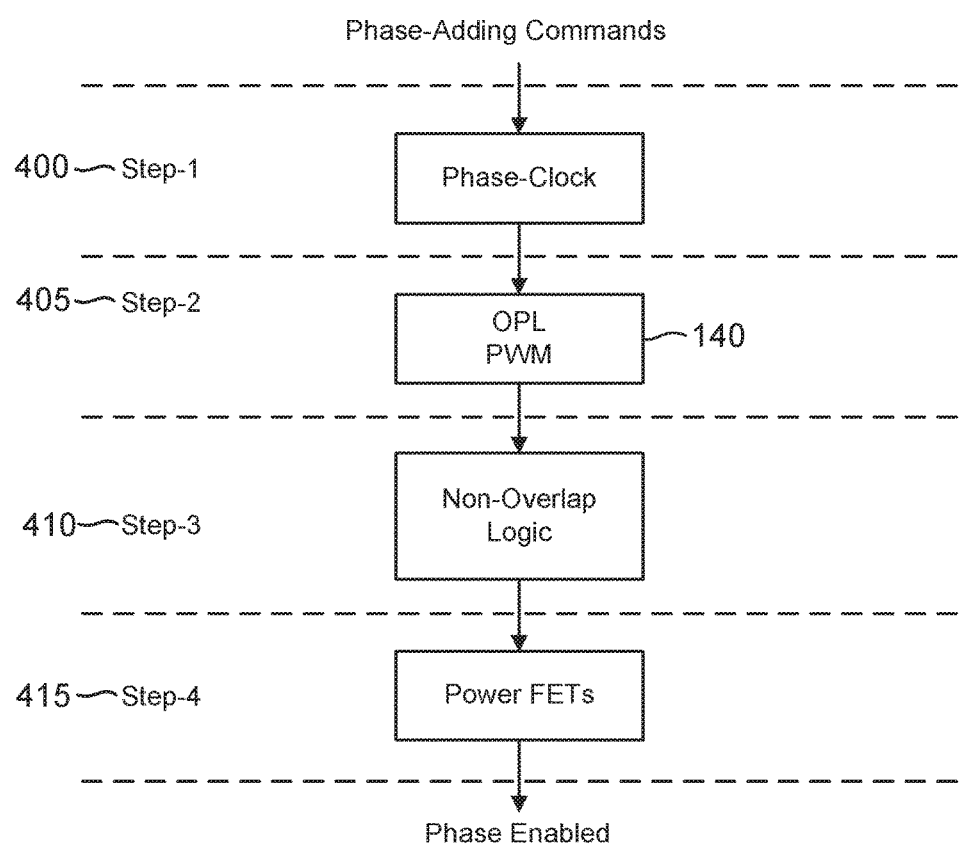
FIG. 4A illustrates a first phase-activation sequence in accordance with an aspect of the disclosure.

The launching of all the phases in open-loop mode may cause undesirable interloop current spikes. To prevent such current spikes, an advantageous launching sequence is disclosed as follows. An example phase-adding sequence is illustrated in FIG. 4A. With regard to this phase-adding sequence, note that each power stage 135 will be responsive to a switching period established by a clock signal. The clock signal is buffered by clock buffers within each power stage 135 that are enabled in an initial step 400. In a subsequent step 405, the OPL PWM control signals 140 are activated and selected by multiplexer 130 to form selected control signals 150. With step 405 completed, a third step 410 is conducted in which the overlap logic within each power stage 135 is activated. In that regard, it is conventional for a power stage 135 in a buck converter to include overlap logic to prevent operation in which both the high-side and the low-side switches would be on. The overlap logic ensures that the low-side switch is off before the high-side switch is switched on. Similarly, the overlap logic ensures that the high-side switch is off before the low-side switch is switched on. Since such overlap logic (as well as the clock buffers) are well-known in the arts, they are not shown in FIGS. 1A and 1B for illustration clarity. After step 410 is completed, a final step 415 is conducted in which the high-side and low-side power switches (e.g., field-effect transistors) are activated. With the completion of step 415, the phase is activated such that it may begin operation at the 100% duty cycle in the subsequent switching period.

Figure 4B:
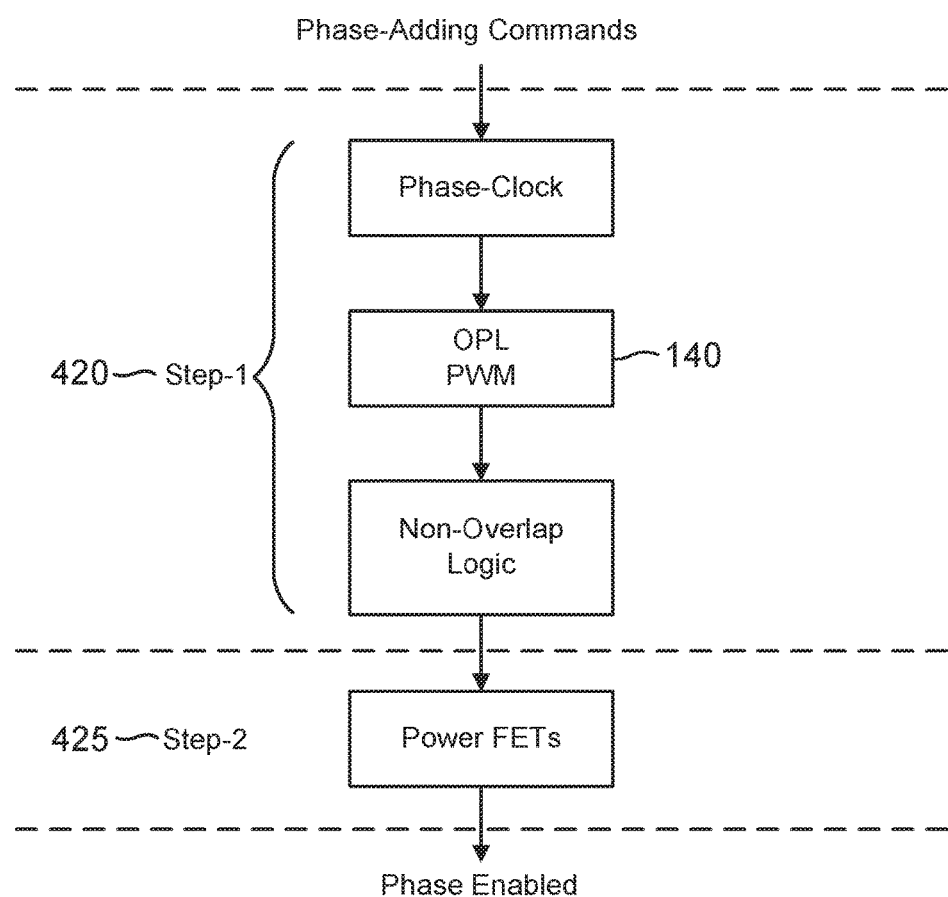
FIG. 4B illustrates a second phase-activation sequence in accordance with an aspect of the disclosure.

It will be appreciated that other suitable phase-activation sequences may be used. For example, an alternative phase-launching sequence is shown in FIG. 4B that includes an initial step 420 in which steps 400, 405, and 410 of FIG. 4A are completed in parallel rather than sequentially. With the completion of step 420, the power FETs are activated in a final step 425 to complete the phase-launching sequence. Regardless of whether the sequence of FIG. 4A or 4B is used, a subsequent de-activation of the phase may be performed in reverse order. For example, a phase may be de-activated by first de-activating the power FETs and then de-activating the non-overlap logic, de-activating the open-loop PWM control signals 140, and de-activating the clock buffers. The de-activation of the non-overlap logic, the open-loop PWM control signals 140, and the clock buffers may be performed sequentially or in parallel. In addition, it will be appreciated that once the output voltage has stabilized (or the output current has stabilized), the open-loop operation of an active phase will be transitioned to closed-loop PWM operation.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A multi-phase switching power converter, comprising;
   a plurality of phases, each phase including a power stage and an inductor, wherein each power stage is configured to implement a duty cycle responsive to a duty cycle control signal;
   a panic mode detector configured to perform an assertion of an open-loop enable signal to trigger an open-loop mode of operation for each phase in response to an output voltage being less than a voltage droop threshold;
   a plurality of pulse-width modulators corresponding to the plurality of phases, each pulse-width modulator configured to generate a closed-loop PWM control signal for its corresponding phase;
   an open-loop pulse width control signal generator configured to generate an open-loop control signal for each phase; and
   a multiplexer configured to respond to the assertion of the open-loop enable signal by selecting for the open-loop control signal for each phase to form each phase's duty cycle control signal.

2. The multi-phase switching power converter of claim 1, wherein the panic-mode detector is configured to perform a de-assertion of the open-loop enable signal responsive to the output voltage equaling a desired output voltage, wherein the multiplexer is further configured to respond to the de-assertion of the open-loop enable signal by selecting for the closed-loop PWM control signal for each phase to form the phase's duty cycle control signal.

3. The multi-phase switching power converter of claim 2, wherein each pulse-width modulator is a dual-edge pulse-width modulator.

4. The multi-phase switching power converter of claim 2, further comprising an error amplifier configured to compare the output voltage to a reference voltage to generate an error signal for each pulse-width modulator.

5. The multi-phase switching power converter of claim 4, wherein the error amplifier includes a compensation network.

6. The multi-phase switching power converter of claim 2, wherein the open-loop pulse width control signal generator is configured to generate the open-loop control signal for each phase to equal a power supply voltage.

7. The multi-phase switching power converter of claim 2, wherein the open-loop pulse width control signal generator comprises a counter configured to control a pulse-width for each open-loop control signal.

8. The multi-phase switching power converter of claim 2, wherein the open-loop pulse width control signal generator comprises a variable RC network configured to control a pulse-width for each open-loop control signal.

9. The multi-phase switching power converter of claim 2, wherein each power stage is configured to implement a 100% duty cycle during the open-loop mode of operation.

10. The multi-phase switching power converter of claim 2, wherein each power stage is configured to implement a 95% duty cycle during the open-loop mode of operation.

11. The multi-phase switching power converter of claim 1, wherein the multi-phase switching power converter comprises a multi-phase buck converter.

12. The multi-phase switching power converter of claim 1, wherein the panic mode detector is configured to activate each phase according to a phase-activation sequence.

13. The multi-phase switching power converter of claim 12, wherein the phase-activation sequence comprises an initial activation of a clock buffer in each power stage, a subsequent activation of the open-loop pulse width control signal generator, a subsequent activation of non-overlap logic in each power stage, and a final activation of field-effect transistor power switches in each power stage.

14. A multi-phase switching power converter, comprising;
   a plurality of phases, each phase including a power stage and an inductor, wherein each power stage is configured to implement a duty cycle responsive to a duty cycle control signal;
   a panic mode detector configured to perform an assertion of an open-loop enable signal to trigger an open-loop mode of operation for each phase in response to a change in an output current for the multi-phase switching power converter exceeding a current change threshold;
   a plurality of pulse-width modulators corresponding to the plurality of phases, each pulse-width modulator configured to generate a closed-loop PWM control signal for its corresponding phase;
   an open-loop pulse width control signal generator configured to generate an open-loop control signal for each phase; and
   a multiplexer configured to respond to the assertion of the open-loop enable signal by selecting for the open-loop control signal for each phase to form each phase's duty cycle control signal.

15. The multi-phase switching power converter of claim 14, wherein the panic-mode detector is configured to perform a de-assertion of the open-loop enable signal responsive to the output current equaling a desired output current, wherein the multiplexer is further configured to respond to the de-assertion of the open-loop enable signal by selecting for the closed-loop PWM control signal for each phase to form the phase's duty cycle control signal.

16. The multi-phase switching power converter of claim 15, wherein each pulse-width modulator is a dual-edge pulse-width modulator.

17. The multi-phase switching power converter of claim 16, further comprising an error amplifier configured to compare an output voltage to a reference voltage to generate an error signal for each pulse-width modulator.

18. A method of open loop operation for a multi-phase buck converter, comprising:

detecting a panic condition selected from the group consisting of an output voltage falling below a voltage droop threshold and a change in an output current exceeding a current change threshold;

in response to the detection of the panic condition, activating each phase in the multi-phase buck converter to operate in an open-loop mode of operation.

19. The method of claim 18, further comprising:

detecting that the panic condition no longer exists; and in response to the detection of the absence of the panic condition, transitioning each phase to a closed-loop pulse-width mode of operation.

20. The method of claim 18, wherein operating each phase in the open-loop mode of operation comprises controlling a power stage in each phase to implement a 100% duty cycle.

21. The method of claim 18, wherein operating each phase in the open-loop mode of operation comprises controlling a power stage in each phase to implement a 95% duty cycle.

* * * * *